(12) United States Patent
Inatani et al.

(10) Patent No.: US 9,466,640 B2
(45) Date of Patent: Oct. 11, 2016

(54) METHOD OF MANUFACTURING SEMICONDUCTOR APPARATUS

(71) Applicant: CANON KABUSHIKI KAISHA, Tokyo (JP)

(72) Inventors: Naoki Inatani, Kawasaki (JP); Daisuke Shimoyama, Yamato (JP); Kei Aoki, Ebina (JP); Masaki Kurihara, Koza-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/614,664

(22) Filed: Feb. 5, 2015

(65) Prior Publication Data

US 2015/0236069 A1  Aug. 20, 2015

(30) Foreign Application Priority Data

Feb. 20, 2014 (JP) ................... 2014-030785
Sep. 11, 2014 (JP) ................... 2014-185699

(51) Int. Cl.
*H01L 27/146* (2006.01)
*H01L 31/0216* (2014.01)
*H01L 31/0232* (2014.01)

(52) U.S. Cl.
CPC ... *H01L 27/14685* (2013.01); *H01L 27/14621* (2013.01); *H01L 27/14627* (2013.01); *H01L 27/14687* (2013.01); *H01L 31/0216* (2013.01); *H01L 31/02327* (2013.01)

(58) Field of Classification Search
CPC .............................................. H01L 27/14627
See application file for complete search history.

(56) References Cited

U.S. PATENT DOCUMENTS

| 7,294,524 | B2 | 11/2007 | Park et al. | |
| 2009/0146236 | A1* | 6/2009 | Lee | G03F 7/033 257/432 |
| 2009/0170233 | A1* | 7/2009 | Yun | H01L 27/14632 438/65 |
| 2012/0007200 | A1* | 1/2012 | Lee | H01L 27/14621 257/432 |
| 2015/0056741 | A1 | 2/2015 | Kurihara | |

FOREIGN PATENT DOCUMENTS

| JP | 2001-326242 A | 11/2001 |
| JP | 2007-073966 A | 3/2007 |
| JP | 2008-034521 A | 2/2008 |
| JP | 2011-146633 A | 7/2011 |
| JP | 2011-176525 A | 9/2011 |

* cited by examiner

*Primary Examiner* — Kimberly Rizkallah
*Assistant Examiner* — Mounir Amer
(74) *Attorney, Agent, or Firm* — Fitzpatrick, Cella, Harper & Scinto

(57) ABSTRACT

A method of manufacturing a semiconductor apparatus, comprising forming a structure including an insulating layer on a substrate, and an electrode on the structure, forming an insulating first film covering the electrode and the structure, forming an opening in a projection, of the first film, formed by a step between upper faces of the electrode and the structure, to expose part of the upper face of the electrode as a first portion, forming a second film covering the first film and the first portion, forming a protective film in the opening by processing the second film, the protective film covering a side face defining the opening and the first portion and being not formed on an upper face of the projection, and forming a third film on the first film and the protective film by spin coating.

16 Claims, 8 Drawing Sheets

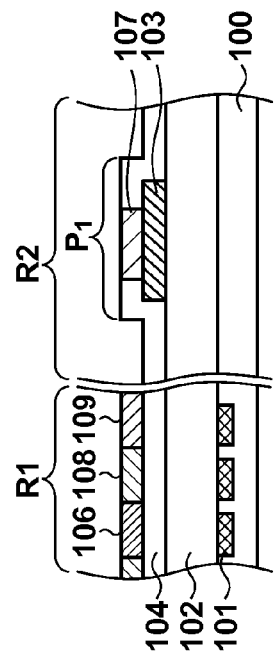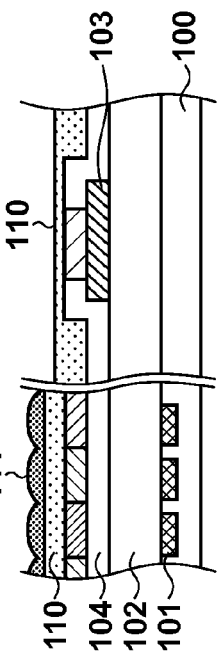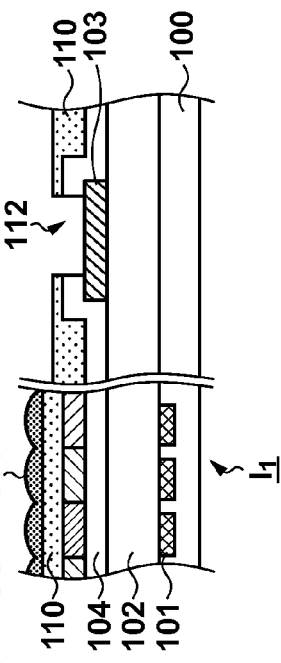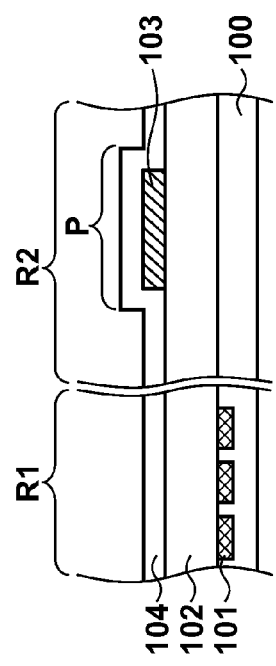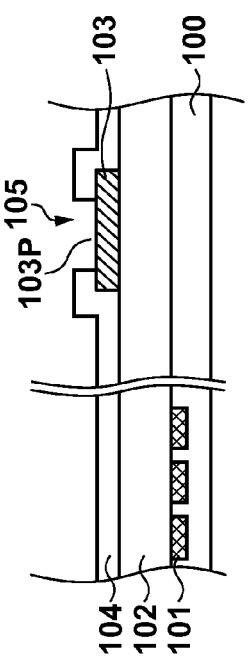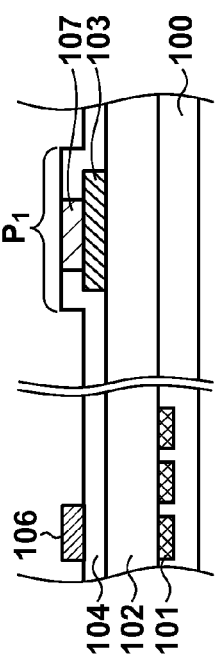

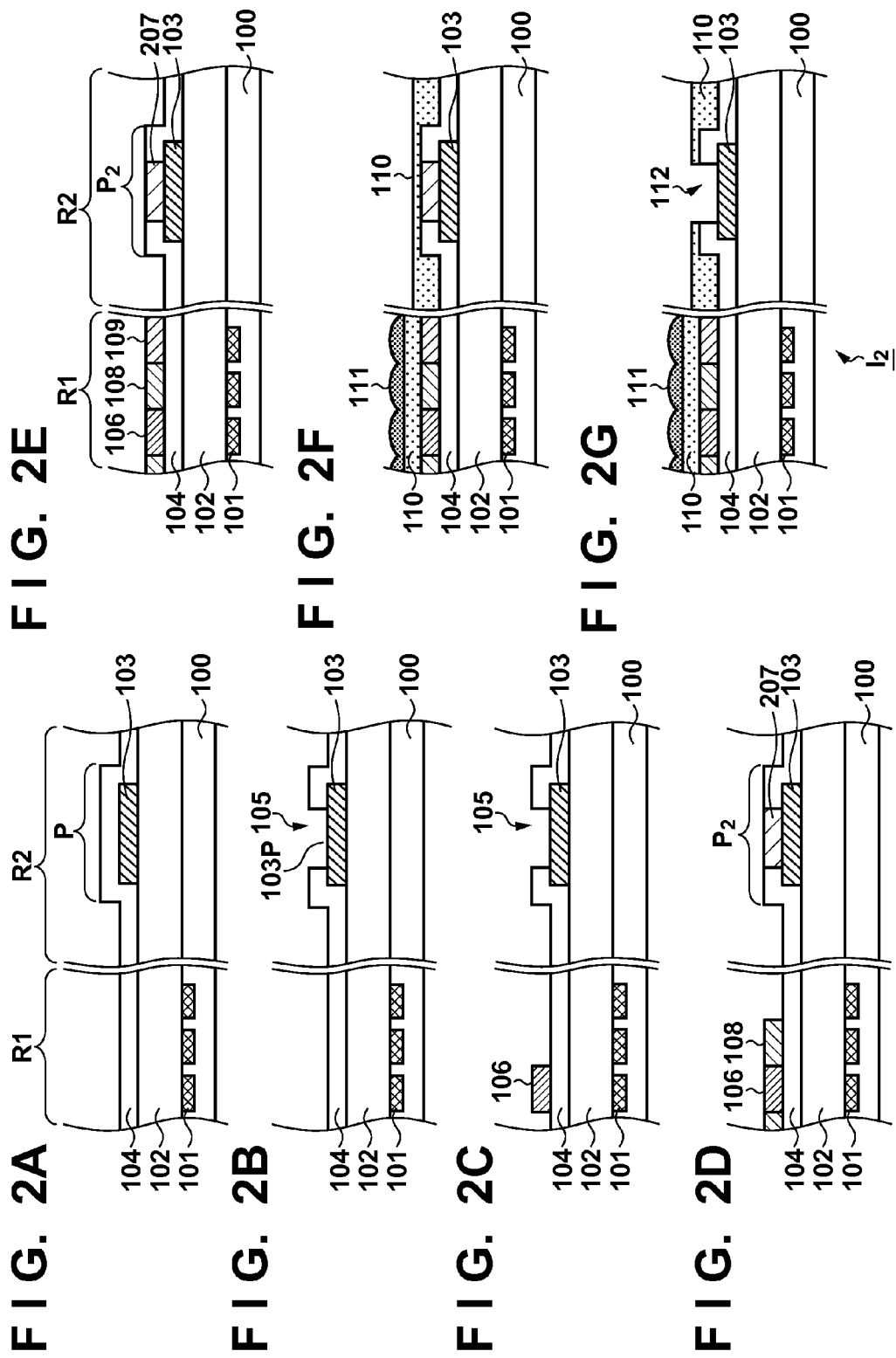

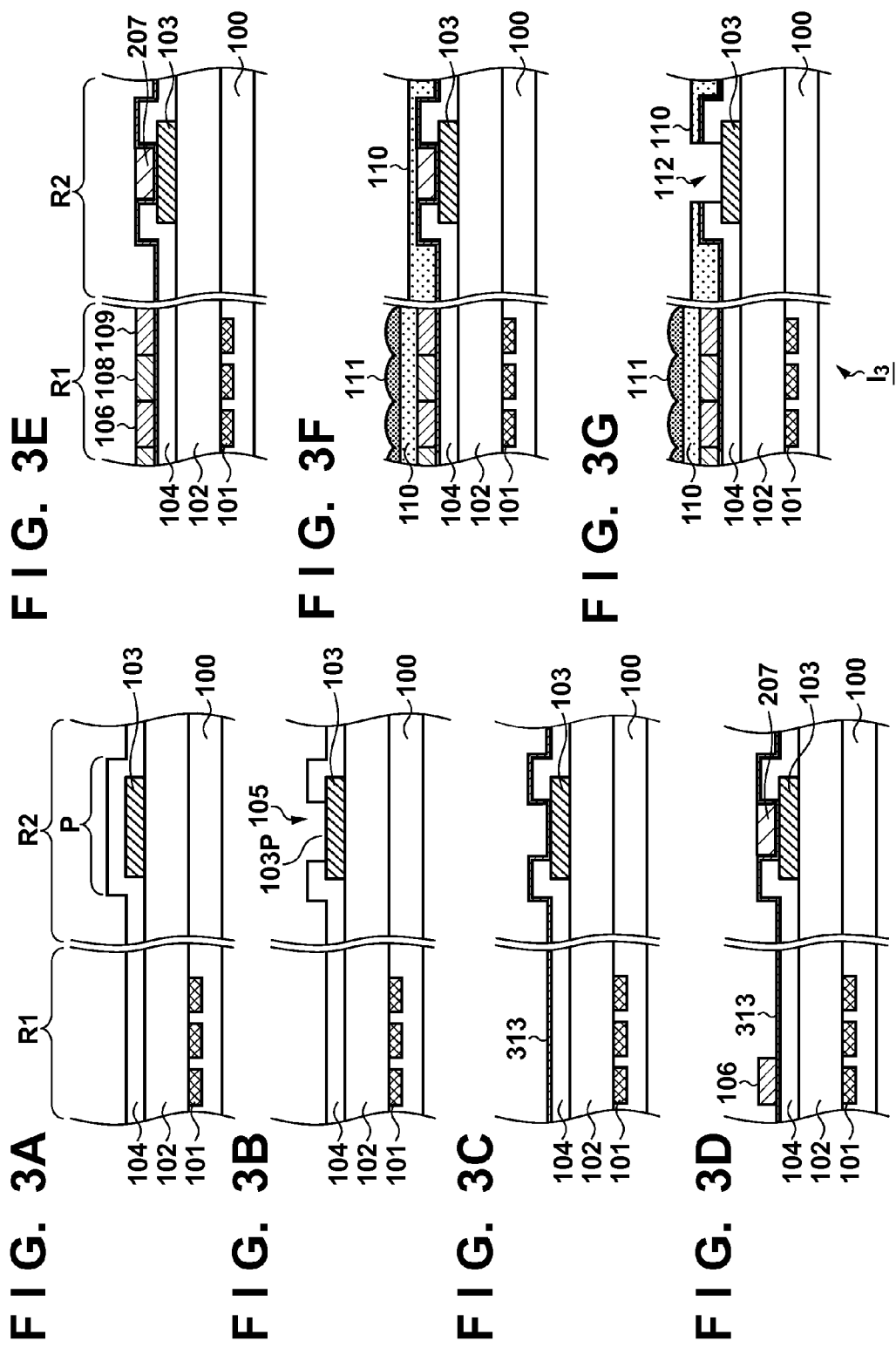

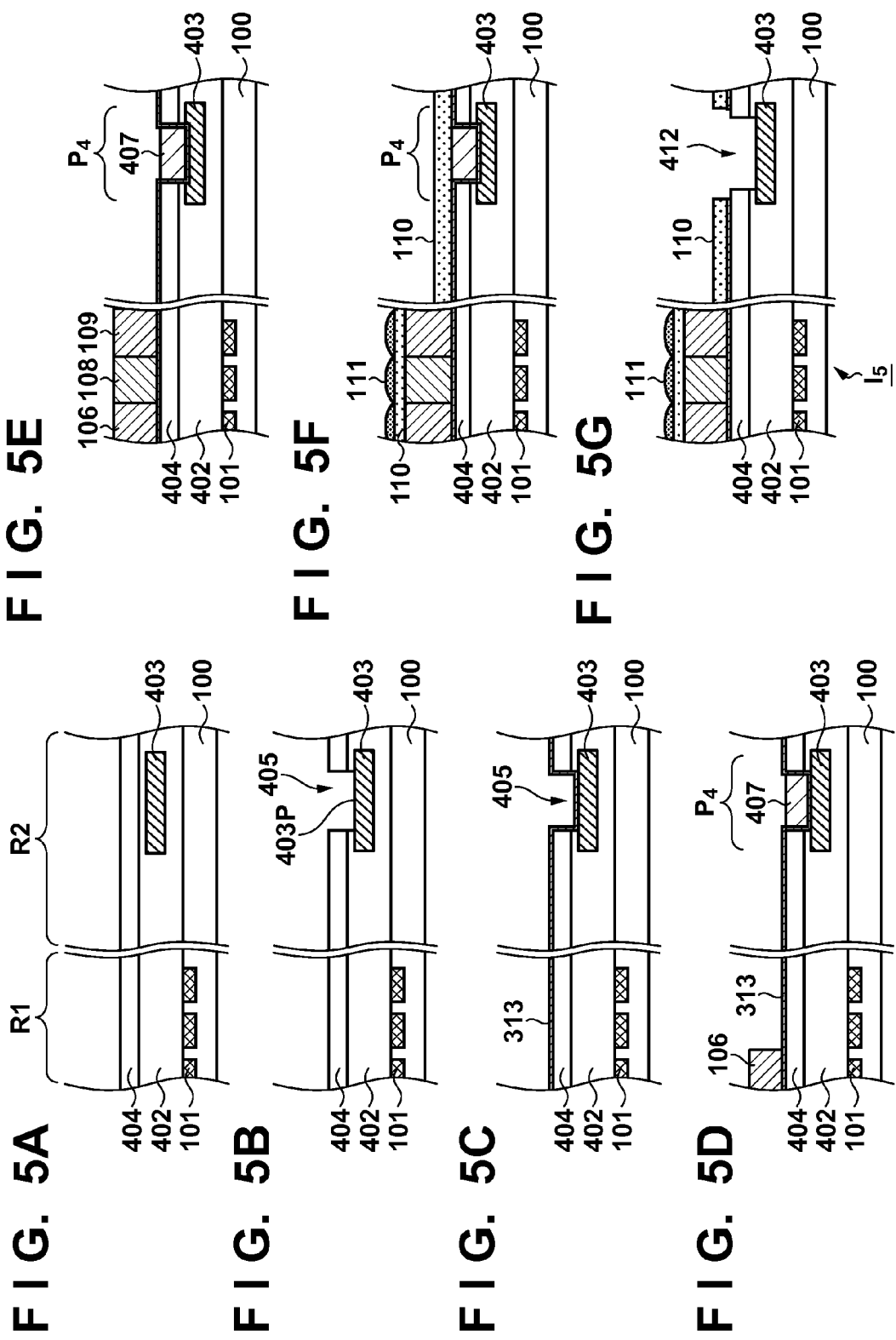

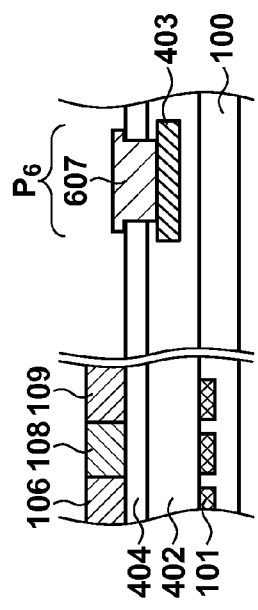
F I G. 6A
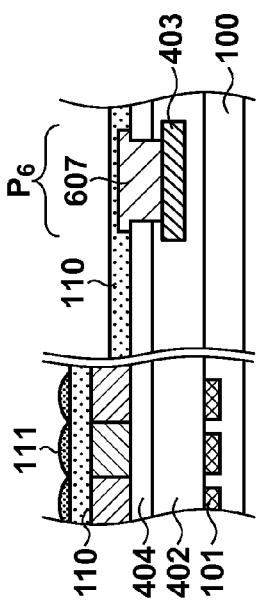
F I G. 6B
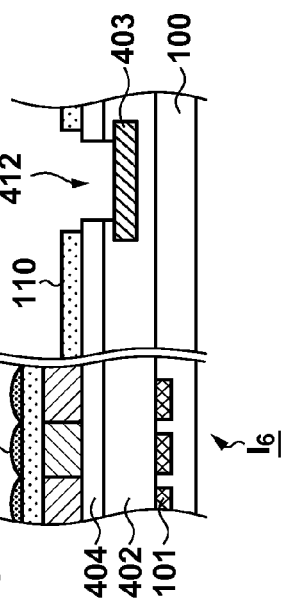
F I G. 6C
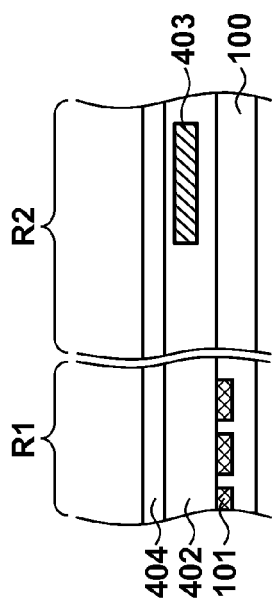
F I G. 6D
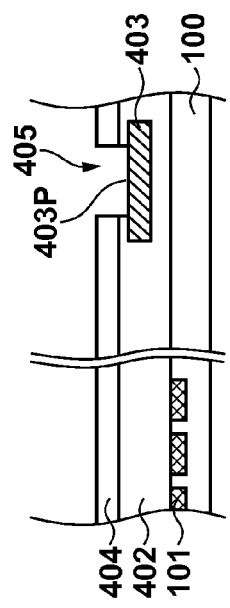
F I G. 6E
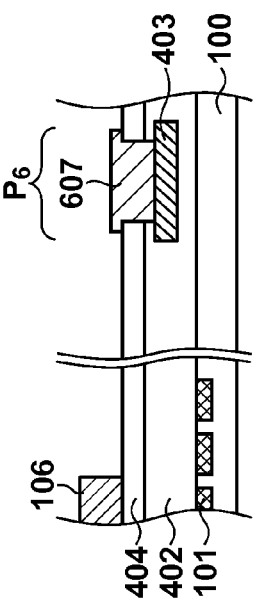
F I G. 6F

METHOD OF MANUFACTURING SEMICONDUCTOR APPARATUS

BACKGROUND OF THE INVENTION

1. Field of the Invention

The present invention relates to a method of manufacturing a semiconductor apparatus.

2. Description of the Related Art

In a semiconductor apparatus manufacturing process, spin coating is used as a method of forming (depositing) a film on a wafer (or substrate). In this method, a film is formed on a whole wafer by supplying a coating solution while the wafer is rotated. If there is a step on the upper face of the wafer, this step may form a line or unevenness (so-called striation) on the film formed by spin coating.

An electrode to be electrically connected to an external apparatus is formed in a semiconductor apparatus, so a step is formed on the upper face of the wafer. For example, even when this electrode is covered with a protective film having an opening which exposes a portion of the upper face of the electrode, a step is formed on the upper face of the protective film.

When further depositing a film on the semiconductor apparatus by spin coating, it is necessary to reduce a step amount (height difference) on the wafer upper face in order to prevent striation.

SUMMARY OF THE INVENTION

The present invention provides a technique advantageous in depositing a film by spin coating in a semiconductor apparatus manufacturing process.

One of the aspects of the present invention provides a method of manufacturing a semiconductor apparatus, comprising a first step of forming a structure including an insulating layer on a substrate, and forming an electrode on the structure, a second step of forming a first film covering the electrode and the structure, the first film being insulative, a third step of forming an opening in a projection of the first film, the projection being formed by a step between an upper face of the electrode and an upper face of the structure out of the first film, such that a first portion which is a part of the upper face of the electrode is exposed, a fourth step of forming a second film covering the first film and the first portion, a fifth step of forming a protective film in the opening by processing the second film, the protective film covering the first portion and a side face defining the opening, and being not formed on an upper face of the projection of the first film, and a sixth step of forming a third film on the first film and the protective film by spin coating.

Further features of the present invention will become apparent from the following description of exemplary embodiments with reference to the attached drawings.

BRIEF DESCRIPTION OF THE DRAWINGS

FIGS. 1A to 1F are views for explaining an example of a solid-state imaging apparatus manufacturing method;

FIGS. 2A to 2G are views for explaining an example of the solid-state imaging apparatus manufacturing method;

FIGS. 3A to 3G are views for explaining an example of the solid-state imaging apparatus manufacturing method;

FIGS. 5A to 5G are views for explaining an example of the solid-state imaging apparatus manufacturing method;

FIGS. 6A to 6F are views for explaining an example of the solid-state imaging apparatus manufacturing method;

DESCRIPTION OF THE EMBODIMENTS

Figure 4A:
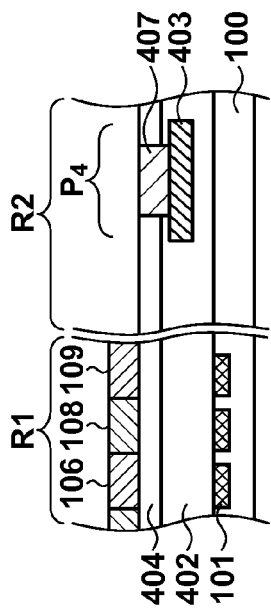
FIGS. 4A to 4F are views for explaining an example of the solid-state imaging apparatus manufacturing method.

Manufacturing methods of the present invention will be explained by taking a solid-state imaging apparatus as an example of a semiconductor apparatus. However, the present invention is also applicable to other semiconductor apparatuses.

First Embodiment

A method of manufacturing a solid-state imaging apparatus (to be referred to as "a solid-state imaging apparatus $I_1$" hereinafter) of the first embodiment will be explained with reference to FIGS. 1A to 1F. The solid-state imaging apparatus $I_1$ can be manufactured by a well-known semiconductor manufacturing process.

FIGS. 1A to 1F schematically show steps in the method of manufacturing the solid-state imaging apparatus $I_1$ according to this embodiment. The solid-state imaging apparatus $I_1$ includes a pixel region R1 in which photoelectric conversion portions such as photodiodes are arranged, and an electrode region R2 in which an electrode for reading out image data obtained by the photoelectric conversion portions is arranged. In the following explanation, a mode in which a pixel array is formed by arranging three types of pixels (red, green, and blue pixels) in accordance with a Bayer array in the region R1 will be exemplified.

In a step shown in FIG. 1A, a substrate 100 in which a plurality of photoelectric conversion portions 101 are arranged in the region R1 is prepared. The substrate 100 is obtained by forming elements such as transistors or photodiodes on a semiconductor substrate by a semiconductor manufacturing process including vapor deposition, patterning, or ion implantation. Alternatively, a substrate on which these elements are already formed may also be prepared.

After that, a structure 102 is formed on the substrate 100. The structure 102 includes at least an insulating layer, and is formed by, for example, alternately forming insulating layers and interconnection layers. An electrode 103 is formed on the region R2 of the structure 102. The electrode 103 includes an electrode for reading out signals obtained by the photoelectric conversion portions 101, and an electrode for supplying a control signal for reading out the signals or supplying electric power. After that, a protective film 104 (an insulating first film) covering the electrode 103 and structure 102 is formed on them.

In a step shown in FIG. 1B, an opening 105 is formed in that portion of the protective film 104, which is positioned inside the periphery of a projection (a convex portion) P formed by a step between the electrode 103 and structure 102, so as to expose a portion (a first portion 103P) of the upper face of the electrode 103.

In a step shown in FIG. 1C, a first color filter 106 (a green color filter) is formed immediately above one of the photoelectric conversion portions 101, which corresponds to a green pixel in the region R1. In this step, in addition to the formation of the color filter 106, a protective film 107 covering the portion 103P is formed in the opening 105 in the region R2.

More specifically, a color filter material film (a second film) is formed by spin coating on the structure obtained in the step shown in FIG. 1B, that is, on the protective film 104 and portion 103P, and the film is patterned by exposure processing and development processing after that. By thus processing the color filter material film, both the color filter 106 and protective film 107 are formed.

The protective film 107 is so formed as to cover the side faces defining the opening 105 (those side faces of the protective film 104, which are exposed in the opening 105) and the portion 103P, and protects the electrode 103 (the portion 103P) from each processing to be performed after that. The protective film 107 does not exist on the upper face of the protective film 104. In FIG. 1C, reference symbol $P_1$ denotes a projection after the protective film 107 is formed in the opening 105.

The protective film 107 is preferably formed in the opening 105 by covering the side faces of the protective film 104 having the side faces and upper face, so as to make the upper face of the projection $P_1$ almost flat. This prevents striation in deposition to be performed by spin coating after that.

For example, the thickness of the electrode 103 is about 5,000 to 9,000 Å, and the film thickness of the protective film 104 is about 4,000 to 7,000 Å. Also, the film thickness of the protective film 107 is about 3,000 to 10,000 Å. In this example, the protective film 104 is 5,000 Å, and the protective film 107 is 4,500 Å, so the height difference of the upper face of the projection $P_1$ (the step between the upper faces of the protective films 104 and 107) is about 500 Å. Accordingly, this upper face is flat enough to prevent striation during deposition performed by spin coating. The protective film 107 desirably has a film thickness twice or less the film thickness of the protective film 104. That is, the height difference of the upper face of the projection $P_1$ is desirably smaller than the film thickness of the protective film 104, for example, desirably about 1,000 to 3,000 Å. In practice, the upper face of the protective film 107 formed in the opening 105 can have an inclination (a small height difference of about 1,000 to 2,000 Å), depending on the size (width) of the opening 105.

To make the upper face of the projection $P_1$ almost flat, it is also possible, for example, to make the film thicknesses of the color filter material forming the protective film 107 and the protective film 104 equal to each other. Furthermore, after patterning for forming the color filter 106 and protective film 107 is performed by exposure processing and development processing, predetermined processing may also be performed to make the upper face of the projection $P_1$ almost flat. More specifically, it is also possible to perform, for example, annealing, laser irradiation, RIE, or CMP in order to shape the patterned protective film 107.

Then, in a step shown in FIG. 1D, a second color filter 108 (a blue color filter) is formed immediately above one of the photoelectric conversion portions 101, which corresponds to a blue pixel in the region R1. Similarly, a third color filter 109 (a red color filter) is formed immediately above one of the photoelectric conversion portions 101, which corresponds to a red pixel. Like the color filter 106 described above, the color filters 108 and 109 are each formed by forming a color filter material film by spin coating, and patterning the film by exposure processing and development processing.

Note that the formation order of the color filters of three colors is not limited to that of the above-mentioned mode.

In a step shown in FIG. 1E, a planarization film 110 is formed over the regions R1 and R2, and an optical system including microlenses 111 corresponding to the photoelectric conversion portions 101 is formed on the planarization film 110. The microlenses 111 may be formed by applying a microlens material and performing exposure processing and development processing after that, and may also be formed by patterning and reflow.

In this embodiment, the protective film 107 is made of the color filter material, and another member (for example, a second planarization film) is not used. This decreases the distance between each photoelectric conversion portion 101 and each microlens 111, and improves the photosensitivity of the solid-state imaging apparatus.

Finally, in a step shown in FIG. 1F, an opening 112 is so formed as to expose the upper face of the electrode 103 by selectively etching away the planarization film 110 and protective film 107 in the region R2. The solid-state imaging apparatus $I_1$ is thus obtained, and mounted on a mount board after that. For example, the electrode 103 of the solid-state imaging apparatus $I_1$ and an electrode of the mount board can electrically be connected by using wire bonding.

In the above manufacturing method, the protective film 107 for protecting the electrode 103 is formed in the opening 105 so as to make the upper face of the projection $P_1$ almost flat as indicated by the step shown FIG. 1C. This makes it possible to prevent a large step from being locally formed. More specifically, the protective film 107 is so formed as to cover the portion 103P and the side faces of the protective film 104 having the side faces and upper face. When compared to, for example, a case in which the protective film 107 is so formed as to cover the upper face of the protective film 104 (the upper face of the projection P) as well, this method decreases the step on the upper face. This prevents striation during spin coating after that. The protective film 107 protects the electrode 103 from each subsequent step, for example, protects the electrode 103 from corrosion caused by a developer in exposure processing and development processing. Accordingly, this embodiment is advantageous in manufacturing the solid-state imaging apparatus $I_1$ having high quality, because the protective film 107 protects the electrode 103 while preventing the occurrence of striation.

Second Embodiment

The second embodiment will be explained with reference to FIGS. 2A to 2G. In the above-described first embodiment, the form in which the protective film 107 is formed when forming the first color filter 106 and protects the electrode 103 from each processing including the step of forming the second color filter 108 and third color filter 109 is exemplified. However, the present invention is not limited to this. For example, it is also possible to form the protective film 107 when forming the second color filter 108, and protect the electrode 103 from each processing for forming the third color filter 109 by the protective film 107.

FIGS. 2A to 2G schematically show steps in a method of manufacturing a solid-state imaging apparatus (to be referred to as "a solid-state imaging apparatus $I_2$" hereinafter) according to this embodiment, in the same manner as in the first embodiment (FIGS. 1A to 1F). Steps shown in FIGS. 2A and 2B are the same as those shown in FIGS. 1A and 1B.

In a step shown in FIG. 2C, a first color filter 106 (a green color filter) is formed immediately above one of photoelectric conversion portions 101, which corresponds to a green pixel in a region R1. The color filter 106 is formed by forming a color filter material film on a protective film 104 and portion 103P by spin coating, and patterning the film by exposure processing and development processing.

In a step shown in FIG. 2D, a second color filter 108 (a blue color filter) is formed immediately above one of the photoelectric conversion portions 101, which corresponds to a blue pixel in a region R1. In this step, in addition to the formation of the color filter 108, a protective film 207 covering the portion 103P is formed in an opening 105 in a region R2. The color filter 108 and protective film 207 are each formed by forming a color filter material film on the structure obtained in the step shown in FIG. 2C, and patterning the film by exposure processing and development processing.

In FIG. 2D, reference symbol $P_2$ denotes a projection after the protective film 207 is formed in the opening 105. Like the above-described projection $P_1$ (the first embodiment), the upper face of the projection $P_2$ is preferably almost flat, and striation during spin coating after that is prevented by decreasing the height difference of the upper face to 5,000 Å or less.

In a step shown in FIG. 2E, a third color filter 109 (a red color filter) is formed on one of the photoelectric conversion portions 101, which corresponds to a red pixel in the region R1. Like the color filter 106 described above, the color filter 109 is formed by forming a color filter material film by spin coating, and patterning the film by exposure processing and development processing.

In a step shown in FIG. 2F, a planarization film 110 is formed over the regions R1 and R2, and an optical system (for example, a microlens 111 corresponding to each photoelectric conversion portion 101) is formed on the planarization film 110.

A step shown in FIG. 2G is the same as that shown in FIG. 1F. The solid-state imaging apparatus $I_2$ is obtained as described above.

As explained in the above-described manufacturing method, the protective film 207 may also be formed together with another color filter (in this embodiment, the second color filter 108). The same effects as those of the first embodiment are obtained in this embodiment as well. That is, this embodiment is advantageous in manufacturing the solid-state imaging apparatus $I_2$ having high quality, because striation during spin coating to be performed later is prevented.

Third Embodiment

The third embodiment will be explained with reference to FIGS. 3A to 3G. This embodiment mainly differs from the first embodiment in that predetermined processing is performed to improve the bonding force between a protective film 104 and color filter 106. For example, an organic material film having bonding force may be formed on the protective film 104 before the color filter 106 is formed. It is also possible to perform organic solvent processing using HMDS (hexamethyldisilazane) or the like on the upper face of the protective film 104. This method improves the bonding force between the protective film 104 and color filter 106, and makes it possible to manufacture a solid-state imaging apparatus having higher quality.

FIGS. 3A to 3G schematically show a method of manufacturing a solid-state imaging apparatus (to be referred to as "a solid-state imaging apparatus $I_3$" hereinafter) according to this embodiment, in the same manner as in the first embodiment (FIGS. 1A to 1F). Steps shown in FIGS. 3A and 3B are the same as those shown in FIGS. 1A and 1B.

In a step shown in FIG. 3C, an organic film 313 (the film thickness is about 5 to 100 Å) is formed on a structure obtained in the step shown in FIG. 3B, that is, on a protective film 104 and portion 103P. The organic film 313 need only be formed by a material having adhesive force, for example, an epoxy resin.

Steps shown in FIGS. 3D to 3G after that are the same as those shown in FIGS. 1C to 1F. The solid-state imaging apparatus $I_3$ is obtained as described above.

In this embodiment, the same effects as those of the first embodiment are obtained. In addition, since the bonding force between the protective film 104 and color filter 106 improves, the solid-state imaging apparatus $I_3$ having higher quality can be manufactured.

Fourth Embodiment

The fourth embodiment will be explained with reference to FIGS. 4A to 4F. In each of the first to third embodiments described above, the mode in which the electrode 103 is formed on the structure 102 including the insulating layers and interconnection layers and the upper face of the protective film 104 formed on the electrode 103 forms a projecting shape is exemplified. However, the present invention is not limited to this mode.

FIGS. 4A to 4F schematically show steps in a method of manufacturing a solid-state imaging apparatus (to be referred to as "a solid-state imaging apparatus $I_4$" hereinafter) according to this embodiment.

In a step shown in FIG. 4A, a structure 402 in which an electrode 403 is embedded in an insulating member is formed on a substrate 100. The structure 402 is formed by, for example, alternately forming insulating layers and interconnection layers, and the electrode 403 is formed in, for example, the uppermost layer of some interconnection layers. CMP may also be performed on the upper face of the structure 402. After that, a protective film 404 (an insulating first film) is formed on the structure 402.

In a step shown in FIG. 4B, an opening 405 is formed inside the periphery of the electrode 403 by partially removing the protective film 404 and insulating member, so as to expose a portion (to be referred to as "a portion 403P" hereinafter) of the upper face of the electrode 403.

Figure 4B:
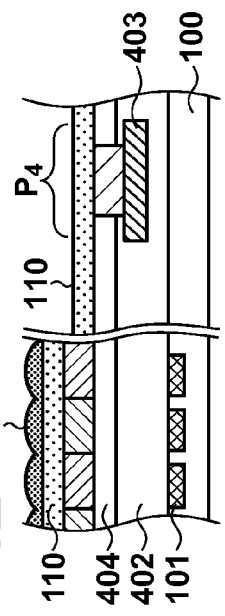
Figure 4C:
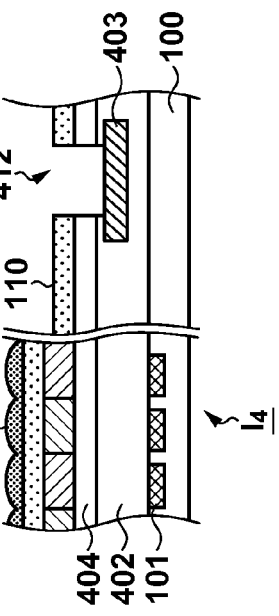

In a step shown in FIG. 4C, a first color filter 106 (a green color filter) is formed immediately above one of photoelectric conversion portions 101, which corresponds to a green pixel in a region R1. In this step, in addition to the formation of the color filter 106, a protective film 407 covering the portion 403P is formed in the opening 405 in a region R2. The color filter 106 and protective film 407 are each formed by forming a color filter material film (a second film) on the protective film 404 and portion 403P by spin coating, and patterning the film by exposure processing and development processing. The protective film 407 is so formed as to cover the side faces defining the opening 405 and the portion 403P, and protects the electrode 403 (the portion 403P) from each processing to be performed after that.

In FIG. 4C, reference symbol $P_4$ denotes a portion after the protective film 407 is formed in the opening 405, and a portion surrounding this portion. Like the above-described projection $P_1$ (the first embodiment), the upper face of the portion $P_4$ is preferably almost flat, and striation during spin coating to be performed after that is prevented by decreasing the height difference of the upper face to 5,000 Å or less.

Figure 4D:
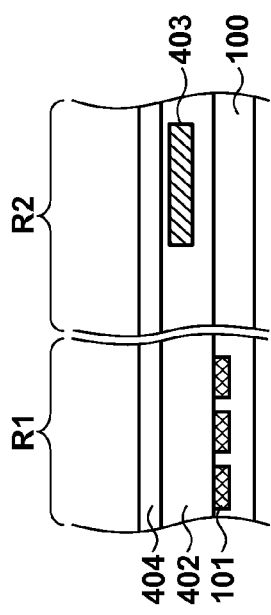
Figure 4E:
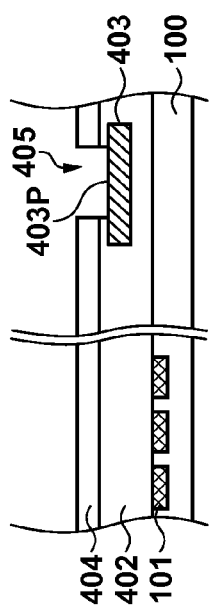
Figure 4F:
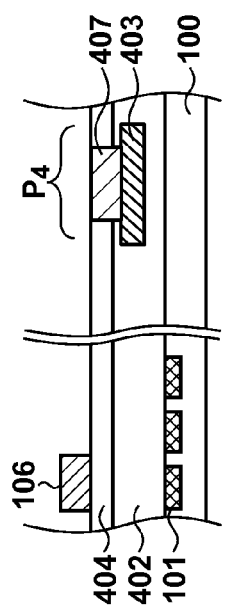

Steps shown in FIGS. 4D to 4F after that are the same as those shown in FIGS. 1D to 1F. The solid-state imaging apparatus $I_4$ is obtained as described above.

As explained in the above-described manufacturing method, the present invention is also applicable to the mode in which the electrode 403 is formed inside the structure 402, and the protective film 404 is formed flat. The same effects as those of the first embodiment are obtained in this embodiment as well.

Fifth Embodiment

The fifth embodiment will be explained with reference to FIGS. 5A to 5G. In the above-described fourth embodiment, the mode in which the upper face of the protective film 404 is flat is exemplified. This embodiment mainly differs from the fourth embodiment in that predetermined processing is performed to improve the bonding force between a protective film 404 and color filter 106. For example, an organic material film having bonding force may be formed on the protective film 404 before the color filter 106 is formed, or organic solvent processing using HMDS or the like may be performed on the upper face of the protective film 404. This method improves the bonding force between the protective film 404 and color filter 106, and can manufacture a solid-state imaging apparatus having higher quality.

FIGS. 5A to 5G schematically show a method of manufacturing a solid-state imaging apparatus (to be referred to as "a solid-state imaging apparatus $I_5$" hereinafter) according to this embodiment, in the same manner as in the fourth embodiment (FIGS. 4A to 4F). Steps shown in FIGS. 5A and 5B are the same as those shown in FIGS. 4A and 4B.

In a step shown in FIG. 5C, an organic film 313 (the film thickness is about 5 to 100 Å) is formed on a structure obtained in the step shown in FIG. 5B, that is, on a protective film 404 and portion 403P. The organic film 313 need only be formed by a material having adhesive force, for example, an epoxy resin.

Steps shown in FIGS. 5D to 5G after that are the same as those shown in FIGS. 4C to 4F. The solid-state imaging apparatus $I_5$ is obtained as described above.

In this embodiment, the same effects as those of the fourth embodiment are obtained. In addition, since the bonding force between the protective film 404 and color filter 106 improves, the solid-state imaging apparatus $I_5$ having higher quality can be manufactured.

Sixth Embodiment

The sixth embodiment will be explained with reference to FIGS. 6A to 6F. This embodiment mainly differs from the above-described fourth embodiment in that a protective film formed in an opening 405 is formed from those side faces of a protective film 404, which are exposed in the opening 405, to a portion of the upper face of the protective film 404 around these side faces.

FIGS. 6A to 6F schematically show a method of manufacturing a solid-state imaging apparatus (to be referred to as "a solid-state imaging apparatus $I_6$" hereinafter) according to this embodiment, in the same manner as in the fourth embodiment (FIGS. 4A to 4F). Steps shown in FIGS. 6A and 6B are the same as those shown in FIGS. 4A and 4B.

In a step shown in FIG. 6C, a first color filter 106 (a green color filter) is formed immediately above one of photoelectric conversion portions 101, which corresponds to a green pixel in a region R1. In this step, in addition to the formation of the color filter 106, a protective film 607 covering a portion 403P is formed in an opening 405 in a region R2.

The color filter 106 and protective film 607 are each formed by forming a color filter material film on a protective film 404 and the portion 403P by spin coating, and patterning the film by exposure processing and development processing. The protective film 607 is so formed as to cover those side faces of the protective film 404, which are exposed in the opening 405, and the portion 403P, and further cover a portion of the upper face of the protective film 404 around the opening 405. In other words, the formed protective film 607 extends over the protective film 404. Note that the extended portion need only have a thickness by which above-described striation is sufficiently suppressed.

In FIG. 6C, reference symbol $P_6$ denotes a portion after the protective film 607 is formed in the opening 405, and a portion surrounding this portion. In the structure of this embodiment, a step formed by the extended portion of the protective film 607 is much smaller than that formed when forming the color filter 106 in the region R1, so above-described striation is sufficiently suppressed. In addition, in this structure, the protective film 607 is formed from those side faces of the protective film 404, which are exposed in the opening 405, to a portion of the upper face of the protective film 404 around these side faces. This is further advantageous in protecting an electrode 403 (the portion 403P) from each processing to be performed later.

Figure 7:
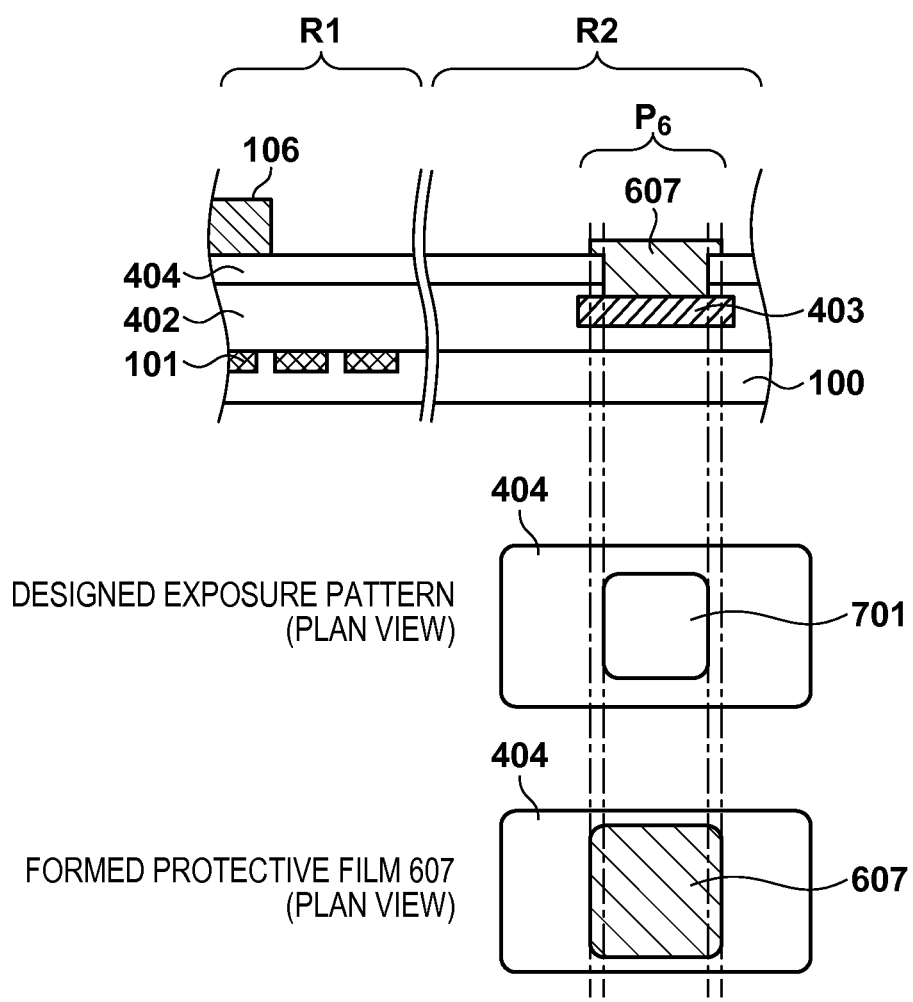
FIG. 7 is a view for explaining an example of the solid-state imaging apparatus manufacturing method.

Referring to FIG. 7, in the region R2, an exposure pattern 701 for forming the protective film 607 is so designed as to match the width of the opening 405 in the protective film 404. The protective film 607 is formed by photolithography by using the exposure pattern 701. In this step, the protective film 607 can be formed to extend over the protective film 404 by adjusting (increasing) the exposure energy such that the dimension of the protective film 607 to be formed becomes larger than the width of the opening 405. In this embodiment, therefore, the size of the protective film 607 in a planar view can be adjusted by exposure. This is advantageous in protecting the electrode 403 even when, for example, a positional shift occurs.

Steps shown in FIGS. 6D to 6F after that are the same as those shown in FIGS. 4D to 4F. The solid-state imaging apparatus $I_6$ is obtained as described above.

In this embodiment as described above, it is possible to reduce striation, and protect the electrode 403 even when a positional shift occurs. This makes the embodiment further advantageous in the manufacture.

Seventh Embodiment

The seventh embodiment will be explained with reference to FIG. 8. In this embodiment, as exemplarily shown in FIG. 8, the shape of an opening 805 differs from that of the opening 405 of the fourth embodiment described previously. The manufacturing method of this embodiment is the same as that of the above-described fourth embodiment, so an explanation thereof will be omitted.

Figure 8:
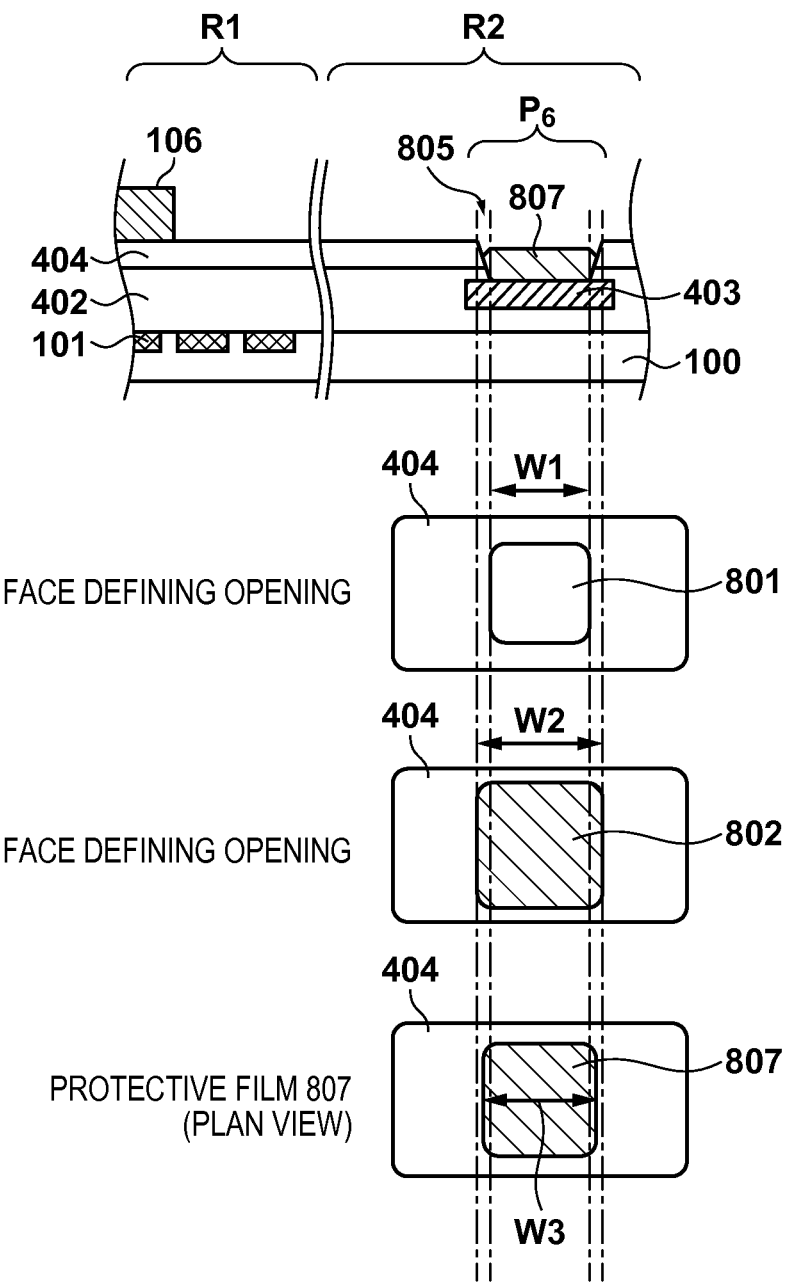
FIG. 8 is a view for explaining an example of the solid-state imaging apparatus manufacturing method.

In this embodiment, the opening 805 formed in a step equivalent to the step shown in FIG. 4B of the fourth embodiment has a tapered shape in a sectional view as shown in FIG. 8. That is, the side faces defining the opening 805 incline, and an upper face 802 defining the opening 805 has an area larger than that of a bottom face 801 defining the opening 805. In this embodiment, a protective film 807 is formed in the opening 805 having this shape.

The area of the upper face of the protective film 807 is smaller than that of the upper face 802 defining the opening 805 and larger than that of the bottom face 801 defining the opening 805. As shown in FIG. 8, let W1 be the width of the bottom face 801 defining the opening 805 along an arbitrary direction, W2 be the width of the upper face 802 defining the opening 805 along the same direction, and W3 be the width of the protective film 807 along the same direction. In this case, W2>W3>W1 holds. Alternatively, W2>W3≥W1 or W2≥W3>W1 may hold.

This embodiment can also reduce striation and protect an electrode 403 even when a positional shift occurs. This makes the embodiment further advantageous in respect of manufacture.

(Others)

The several preferred embodiments have been exemplified above, but the present invention is not limited to these embodiments, and it is also possible to partially change the embodiments and combine the embodiments in accordance with the purpose or the like. For example, in each of the above-described embodiments, the form in which the protective film 107 or the like is formed together with the color filter 106 or the like is exemplified. However, the protective film 107 or the like may also be formed together with a film other than the color filter 106 or the like. Also, in each of the above-described embodiments, the arrangement in which the interconnection layer is formed between the substrate and electrode is exemplified. However, it is also possible to position the substrate between the interconnection layer and electrode. Furthermore, in each of the above-described embodiments, the mode in which one microlens 111 is formed for one photoelectric conversion portion is described. However, one microlens 111 may also be formed for a plurality of photoelectric conversion portions.

Moreover, in each of the above embodiments, the method of manufacturing the solid-state imaging apparatus to be included in an imaging system such as a camera is taken as an example of the method of manufacturing a semiconductor apparatus. The concept of the imaging system includes not only an apparatus whose main purpose is shooting, but also an apparatus (for example, a personal computer or portable terminal) secondarily including a shooting function. This imaging system can include the solid-state imaging apparatus according to the present invention exemplified in each of the above-mentioned embodiments, and a processing unit for processing signals output from this solid-state imaging apparatus. This processing unit can include an A/D converter, and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2014-030785, filed Feb. 20, 2014, and 2014-185699, filed Sep. 11, 2014, which are hereby incorporated by reference herein in their entirety.

What is claimed is:

1. A method of manufacturing a solid-state imaging apparatus, including a plurality of photoelectric conversion portions arranged on a substrate, a plurality of microlenses formed to correspond to the plurality of photoelectric conversion portions, and a plurality of color filters of a plurality of colors formed between the substrate and the plurality of microlenses, the method comprising:

forming a structure including an insulating layer on the substrate, and forming an electrode on the structure;

forming a first film covering the electrode and the structure, the first film being insulative;

forming an opening in a projection of the first film, the projection being formed by a step between an upper face of the electrode and an upper face of the structure out of the first film, such that a first portion which is part of the upper face of the electrode is exposed;

forming a second film covering the first film and the first portion;

forming a protective film in the opening and a first color filter having one of the plurality of colors, simultaneously, by processing the second film, the protective film covering the first portion and a side face defining the opening, and being not formed on an upper face of the projection of the first film; and forming a third film on the first film and the protective film by spin coating.

2. The method according to claim 1, wherein the forming of the protective film and the first color filter includes patterning the second film by performing exposure processing and development processing of the second film.

3. The method according to claim 1, wherein a height difference between the upper face of the projection of the first film and an upper face of the protective film is not more than 5,000 Å.

4. The method according to claim 1, further comprising forming a second color filter having a color different from that of the first color filter by performing exposure processing and development processing of the third film.

5. The method according to claim 4, further comprising, after the forming of the opening and before the forming of the second film, forming a fourth film covering the first film and the first portion, and forming a third color filter having a color different from those of the first color filter and the second color filter by performing exposure processing and development processing of the fourth film.

6. The method according to claim 1, further comprising, after the forming of the third film, removing the protective film such that at least a part of the first portion is exposed.

7. The method according to claim 1, wherein a film thickness of the first film and a film thickness of the second film are equal.

8. The method according to claim 1, further comprising, after the forming of the opening and before the forming of the second film, forming, on the first film, a film of an organic material for bonding the first film and the second film.

9. The method according to claim 8, wherein a film thickness of the organic material film is 5 to 100 Å.

10. The method according to claim 8, wherein the organic material is an epoxy resin.

11. A method of manufacturing a solid-state imaging apparatus, including a plurality of photoelectric conversion portions arranged on a substrate, a plurality of microlenses formed to correspond to the plurality of photoelectric conversion portions, and a plurality of color filters of a plurality of colors formed between the substrate and the plurality of microlenses, the method comprising:

forming, on the substrate, a structure in which an electrode is embedded in an insulating member;

forming a first film covering the structure, the first film being insulative;

forming an opening in the first film by removing a portion of the first film and a portion of the insulating member, such that a first portion which is part of an upper face of the electrode is exposed;

forming a second film covering the first film and the first portion;

forming a protective film in the opening and a first color filter having one of the plurality of colors, simultaneously, by processing the second film, the protective film covering the first portion and a side face defining the opening, and being not formed on an upper face of the first film; and forming a third film on the first film and the protective film by spin coating.

12. The method according to claim 11, further comprising forming a second color filter having a color different from that of the first color filter, by performing exposure processing and development processing of the third film.

13. The method according to claim 12, further comprising, after the forming of the opening and before the forming of the second film, forming a fourth film covering the first film and the first portion, and forming a third color filter having a color different from those of the first color filter and the second color filter, by performing exposure processing and development processing on the fourth film.

14. A method of manufacturing a solid-state imaging apparatus, including a plurality of photoelectric conversion portions arranged on a substrate, a plurality of microlenses formed to correspond to the plurality of photoelectric conversion portions, and a plurality of color filters of a plurality of colors formed between the substrate and the plurality of microlenses, the method comprising:

forming a structure including an insulating layer on the substrate, and forming an electrode on the structure;

forming a first film covering the electrode and the structure, the first film being insulative;

forming an opening by removing a portion of the first film and a portion of the insulating member, such that a first portion which is part of an upper face of the electrode is exposed;

forming a second film covering the first film and the first portion;

forming an exposure pattern and a first color filter having one of the plurality of colors, simultaneously, by exposing the second film, the exposure pattern covering the first portion and a side face defining the opening, and being not formed on an upper face of the first film; and forming a third film on the first film and the exposure pattern by spin coating.

15. The method according to claim 14, further comprising forming a second color filter having a color different from that of the first color filter by performing exposure processing and development processing on the third film.

16. The method according to claim 15, further comprising, after the forming of the third film, forming a fourth film covering the first film and the first portion, and forming a third color filter having a color different from those of the first color filter and the second color filter by performing exposure processing and development processing on the fourth film.

* * * * *